United States Patent
Kasahara

(10) Patent No.: US 7,369,005 B2
(45) Date of Patent: May 6, 2008

(54) COLPITTS OSCILLATOR

(75) Inventor: Kenji Kasahara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/447,190

(22) Filed: Jun. 5, 2006

(65) Prior Publication Data
US 2006/0273860 A1 Dec. 7, 2006

(30) Foreign Application Priority Data
Jun. 7, 2005 (JP) ............................. 2005-166618

(51) Int. Cl.
*H03B 5/32* (2006.01)
(52) U.S. Cl. .............. 331/158; 331/116 R; 331/116 FE
(58) Field of Classification Search ................ 331/158, 331/116 R, 116 FE
See application file for complete search history.

(56) References Cited

U.S. PATENT DOCUMENTS 3,569,865 A * 3/1971 Healey, III .............. 331/116 R

* cited by examiner

*Primary Examiner*—Arnold Kinkead
(74) *Attorney, Agent, or Firm*—Jordan and Hamburg LLP

(57) ABSTRACT

Oscillation in which unwanted vibration (B mode) is surely suppressed while stable oscillation by principal vibration (C mode) is obtained is obtained. In a Colpitts oscillator including a piezoelectric vibrator, a transistor, and a first and second divided capacitive components, by inserting a feedback circuit formed by connecting a third capacitive component and a first inductor in series between a connection midpoint between the first capacitive component and the second capacitive component and an emitter of the transistor, inserting a second inductor in parallel with the second capacitive component, and setting the parallel resonance frequency of the second capacitive component and the second inductor in the vicinity of the oscillation frequency of the oscillator, the frequency band in which the negative resistance of the circuit side seen from the piezoelectric vibrator appears is set to a narrow band containing only a desired frequency to suppress unwanted vibration of the oscillator.

7 Claims, 9 Drawing Sheets

RELATED ART

RELATED ART

RELATED ART

RELATED ART

RELATED ART

COLPITTS OSCILLATOR

BACKGROUND OF THE INVENTION

1. Field of the Invention

The present invention relates to a piezoelectric oscillator, for example, with crystalline quartz as a piezoelectric vibrator, and particularly relates to a Colpitts oscillator which oscillates stably by principal vibration and suppresses unwanted vibration.

2. Description of the Related Art

Piezoelectric oscillators are used for many electronic devices including a mobile communication base station because of their high stability of frequency. When an SC-cut quartz vibrator or an IT-cut quartz vibrator is used as a piezoelectric vibrator of the piezoelectric oscillator, the stress sensitivity characteristic, shock resistance characteristic, and so on are superior to those when an AT-cut quartz vibrator is used, so that the SC-cut quartz vibrator or the IT-cut quartz vibrator has been used a lot in recent years.

FIG. 7 is a diagram showing a resonance characteristic of the SC-cut vibrator. The horizontal axis represents the frequency, and the vertical axis represents the reactance. As is clear from this figure, in addition to a C mode (thickness shear vibration) as principal vibration, an A mode (thickness extensional vibration) and a B mode (thickness twist vibration) exist. In particular, the B mode adjacent to the C mode as the principal vibration lies closer to the high frequency side than the C mode by about 9%, and is sometimes more stressed than the C mode as the principal vibration.

Therefore, in the oscillator, oscillation in the B mode as unwanted vibration becomes a problem, or a frequency jump in which the oscillation frequency changes from that of the C mode as the principal vibration to that of the B mode as the unwanted vibration becomes a problem.

Various oscillators to solve this problem are proposed (See Patent Documents 1 and 2, for example). In an oscillator in Patent Document 1, as FIG. 8 shows a circuit configuration, in addition to an oscillating quartz vibrator X1 of a Colpitts oscillator, an AT-cut quartz vibrator X2 is inserted between a midpoint (division point) of a series circuit of divided capacitive components C1 and C2 and a connection point between an emitter of a transistor Q1 and a feedback resistance R3, and the series resonance frequency of the quartz vibrator X2 is set to substantially coincide with the oscillation frequency of the principal vibration (C mode). As a modified example thereof, as FIG. 9 shows a circuit configuration, in place of the quartz vibrator X2, a feedback circuit composed of a series circuit of an inductor L1 and a capacitive component C3 is provided. FIG. 10 shows a negative resistance characteristic in the configuration of FIG. 9.

In an oscillator in Patent Document 2, as FIG. 11 shows a circuit configuration, as a feedback circuit, divided capacitive components C3 and C4 are provided in parallel with a feedback resistance R4, and an inductor L1 and a variable reactance Z are provided from a connection point between the divided capacitive components C3 and C4. FIG. 12 shows a negative resistance characteristic in the configuration of FIG. 11.

(Patent Document 1)
Patent Publication No. 3268726
(Patent Document 2)
Patent Publication No. 3283493

An oscillator circuit in Patent Document 1 shown in FIG. 8 has a problem that it is expensive because it needs the B mode suppressing quartz vibrator X2 in addition to the oscillating quartz vibrator X1, that is, it needs two quartz vibrators.

In this regard, in an oscillator circuit shown in FIG. 9 (modified example of Patent Document 1), the B mode suppressing quartz vibrator X2 becomes unnecessary. However, when the series circuit of the capacitive component C3 and the inductor L1 is provided, it becomes difficult to obtain a characteristic equal to a frequency selection characteristic of the quartz vibrator X2 since its resonance characteristic is not so steep as that of the quartz vibrator. When the frequency of the principal vibration is high, the steepness of the resonance characteristic does not become a problem since the difference between a frequency corresponding to the C mode and a frequency corresponding to the B mode is large, but when the frequency of the principal vibration is low, the steepness of the resonance characteristic of the resonance circuit for frequency selection becomes a problem since the difference between the frequency corresponding to the C mode and the frequency corresponding to the B mode is small. In the case of this circuit configuration, as FIG. 10 shows the negative resistance characteristic, relative to a negative resistance value at the principal vibration (C mode) frequency, the same level of negative resistance value is shown even at the unwanted vibration (B mode) frequency, so that the suppression of the unwanted vibration cannot be expected.

An oscillator circuit in Patent Document 2 shown in FIG. 11 is designed so that by inserting the feedback circuit composed of the divided capacitive components C3 and C4 and the inductance (L1+Z) in a basic circuit of the Colpitts oscillator, the feedback circuit becomes a path at the frequency of the C mode and it is attenuated at the frequency of the B mode. As shown in FIG. 12, the negative resistance characteristic in this configuration exhibits an improvement in the negative resistance value at the frequency of the B mode as compared with that in FIG. 10.

However, in the example in FIG. 12, even at the frequency of the B mode, the negative resistance value is "−45Ω" which is a relatively high value, and hence there is a possibility that this negative resistance value causes the unwanted vibration of the B mode depending on the difference of the piezoelectric characteristic of the used quartz vibrator X1 and the mounting structure of the oscillator circuit.

Furthermore, in FIG. 11, the variable reactance Z can reduce the negative resistance value of the B mode by allowing oscillation frequency drift to be adjustable with respect to the occurrence of a constant error between circuit elements at the time of mounting, and besides by setting the peak of the negative resistance value to a frequency lower than that of the C mode by the adjustment by the reactance. However, in this frequency adjustment method, the negative resistance value of the C mode also reduces and it is difficult to increase the negative resistance value of the B mode to a positive value, so that the unwanted vibration cannot be surely suppressed.

SUMMARY OF THE INVENTION

An object of the present invention is to provide a Colpitts oscillator which makes an unwanted vibration (for example, B mode) suppressing quartz vibrator unnecessary, and without lowering a negative resistance value at a frequency of principal vibration (for example, C mode), can obtain a value having a small absolute value or a positive value as a negative resistance value at an unwanted vibration frequency and surely suppress unwanted vibration while obtaining stable oscillation by principal vibration.

The present invention is characterized by a Colpitts oscillator, including:

a piezoelectric vibrator;

an oscillation amplifying transistor whose base is connected to the piezoelectric vibrator;

a series circuit which is connected between a connection point between the piezoelectric vibrator and the base of the transistor and a ground and in which a first capacitive component and a second capacitive component are connected in series;

a feedback circuit which is connected between a connection point between the first capacitive component and the second capacitive component and an emitter of the transistor and in which a third capacitive component and a first inductor are connected in series; and a second inductor which is connected in parallel with the second capacitive component, in which a parallel resonance frequency of a parallel circuit in which the second capacitive component and the second inductor are connected in parallel is set in a vicinity of an oscillation frequency of the oscillator.

The piezoelectric vibrator is, for example, an SC-cut quartz vibrator or an IT-cut quartz vibrator, and the oscillation frequency of the oscillator is a frequency, for example, of a C mode. This configuration makes it possible that the frequency band in which the negative resistance of the circuit side seen from the piezoelectric vibrator appears becomes a narrow band containing only a desired oscillation frequency to thereby suppress unwanted vibration of the oscillator.

DETAILED DESCRIPTION OF THE PREFERRED EMBODIMENT

Figure 1:
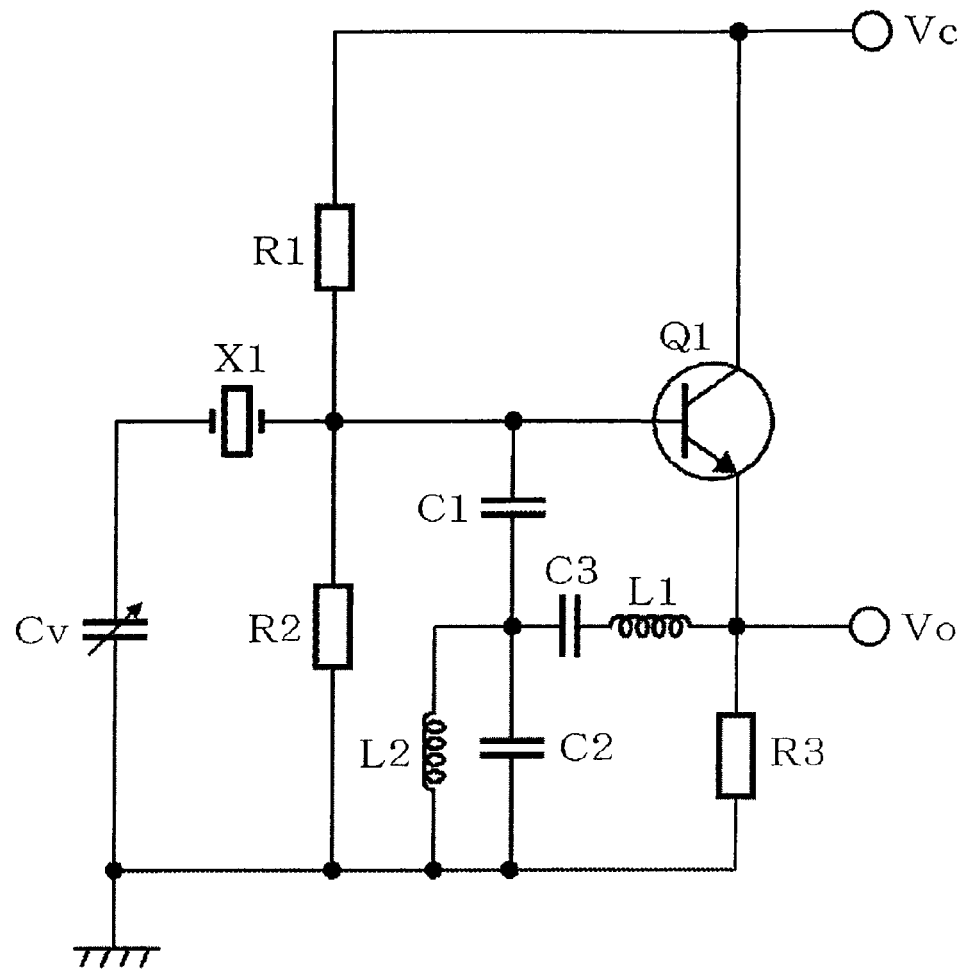
FIG. 1 is a circuit diagram showing an embodiment of the present invention.

FIG. 1 is a circuit diagram of a Colpitts oscillator showing an embodiment of the present invention.

A transistor Q1 as an element for amplifying oscillation is constructed as an emitter follower circuit, and one end of a quartz vibrator X1 is connected to a base thereof. The other end of the quartz vibrator X1 is grounded via a variable capacitive component Cv. A series circuit of divided capacitive components C1 and C2 is connected between the base of the transistor Q1 and a ground. One end of the capacitive component C1 is connected to the base of the transistor Q1, and the other end of the capacitive component C2 connected in series with the capacitive component C1 is grounded. A feedback resistance R3 is connected between an emitter of the transistor Q1 and the ground, and a collector is directly connected to a power supply Vc. A series circuit of a capacitive component C3 and an inductor L1 is inserted between an intermediate point between the divided capacitive components C1 and C2 and the emitter of the transistor Q1, and an inductor L2 is inserted in parallel with the divided capacitive component C2. A bleeder resistance R1 is connected between the power supply Vc and the base of the transistor Q1, and a bleeder resistance R2 is connected between the base and the ground. Incidentally, an output terminal Vo is obtained from the emitter of the transistor Q1.

Figure 9:
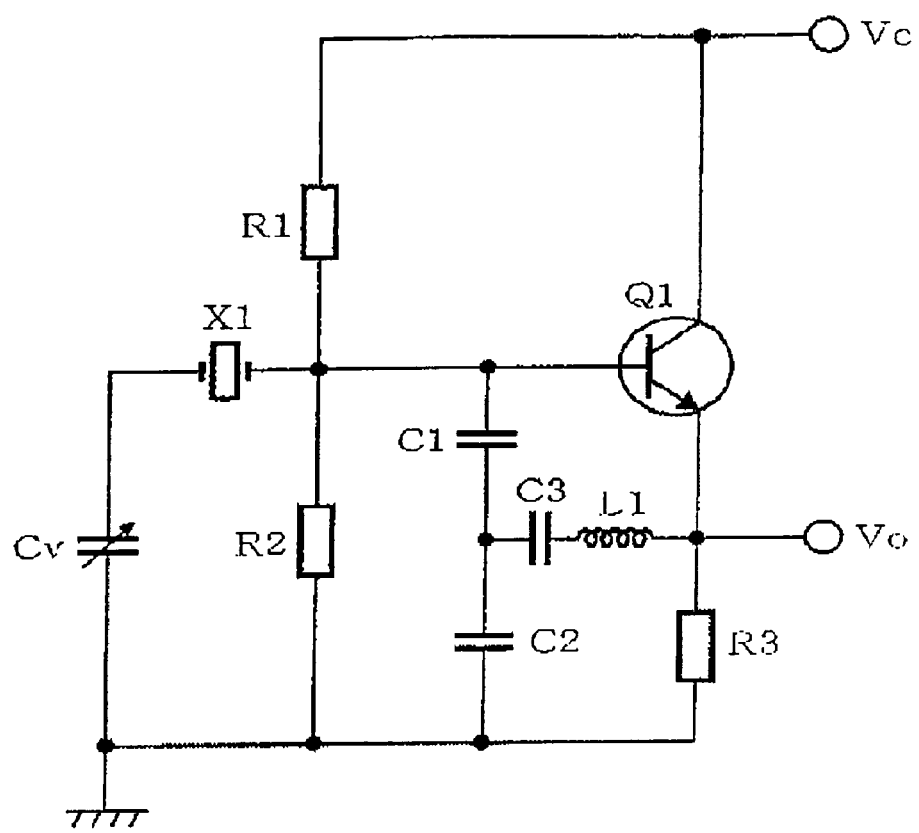
FIG. 9 is another conventional oscillator circuit diagram.
Figure 10:
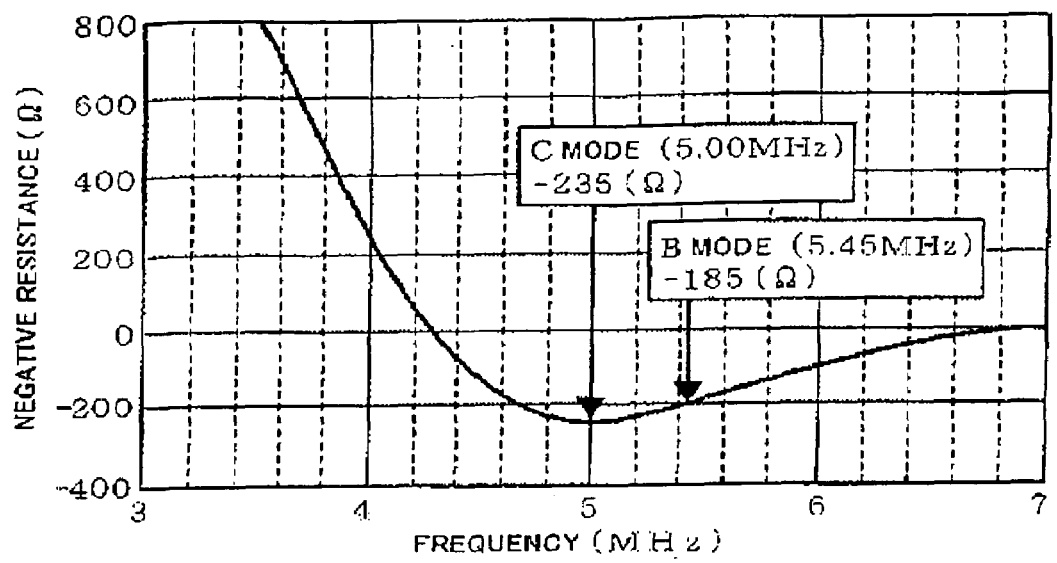
FIG. 10 is a negative resistance characteristic diagram of FIG. 9.
Figure 11:
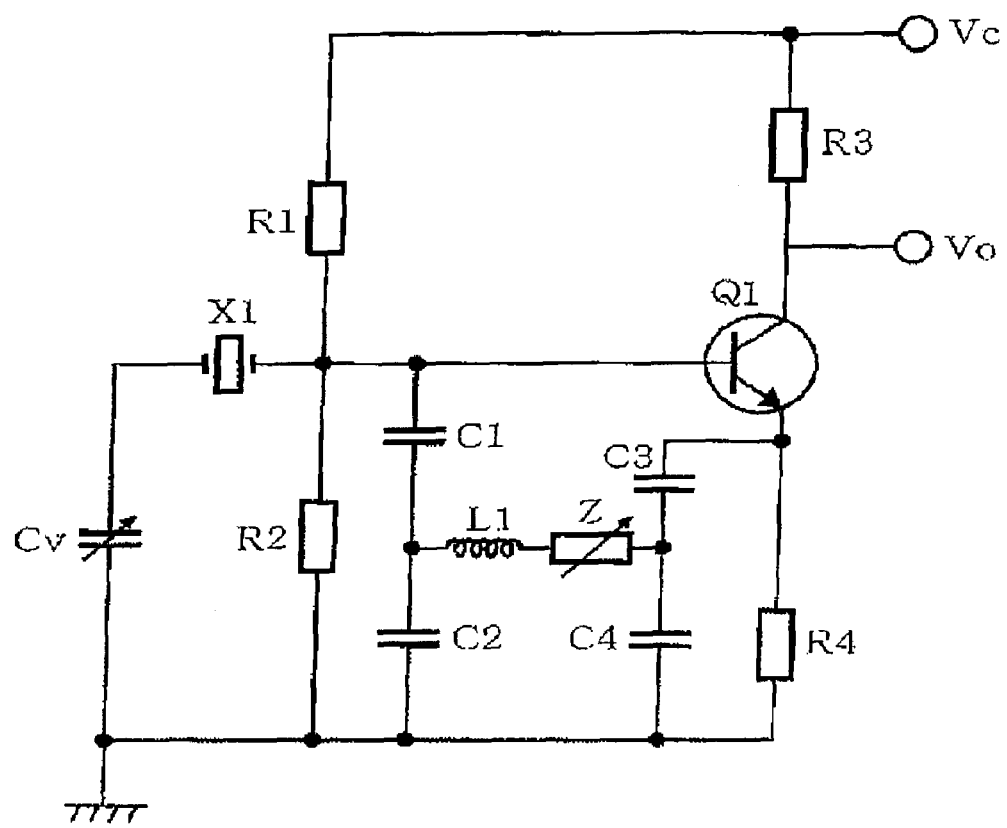
FIG. 11 is still another conventional oscillator circuit diagram.
Figure 12:
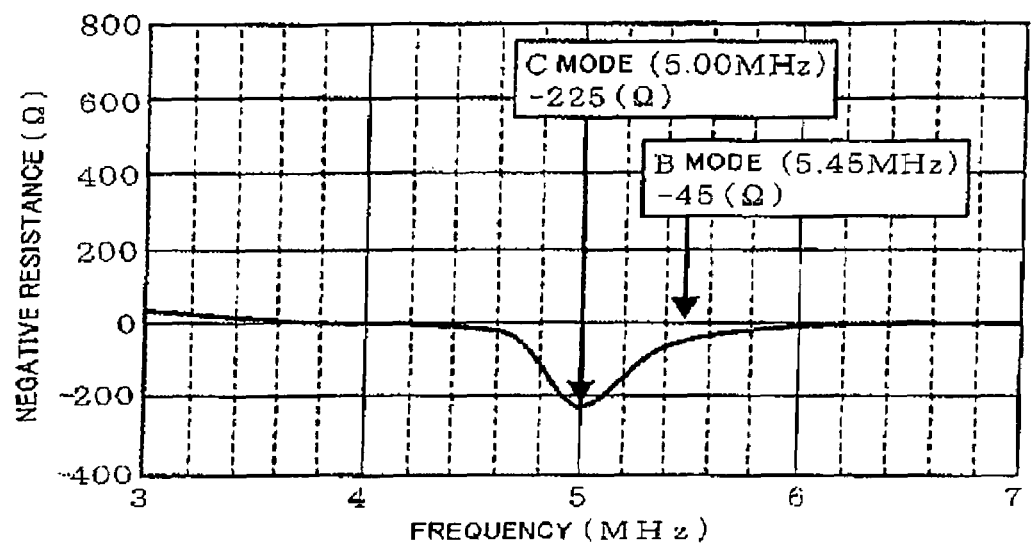
FIG. 12 is a negative resistance characteristic diagram of FIG. 11.

The Colpitts oscillator thus constructed is designed to prevent a frequency jump to an unwanted mode from occurring when the quartz oscillator is manufactured using an SC-cut quartz vibrator. Namely, a feedback circuit of the oscillator is constructed as a circuit such as becomes a path at the frequency of a C mode and is attenuated at the frequency of a B mode, and its circuit configuration is different from that in FIG. 9 in that an inductor L2 is provided in parallel with the capacitive component C2.

Figure 2:
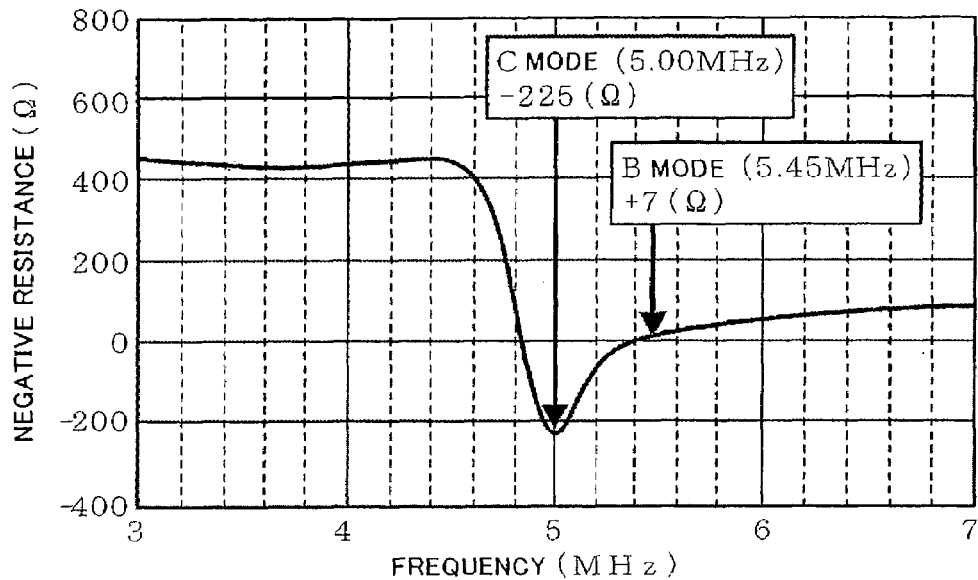
FIG. 2 is a negative resistance characteristic diagram showing a simulation result of an oscillator of the embodiment.

As a result of circuit simulation performed by variously changing the circuit of the divided capacitive components C1 and C2, the capacitive component C3, the inductor L1 and the inductor L2 in the Colpitts oscillator in FIG. 1, a narrow-band negative resistance characteristic shown in FIG. 2 is obtained under the condition of C1=43 pF, C2=470 pF, C3=4700 pF, L2=2.2 μH, and L1=10 μH. From the negative resistance characteristic in FIG. 2, a sufficiently large negative resistance is obtained at the frequency of the C mode (5 MHz) as the principal vibration, and the negative resistance becomes a positive value in the B mode (about 5.45 MHz). From this, the realization of an oscillator which oscillates only in the C mode without satisfying an oscillation condition even if the equivalent constant of the quartz vibrator in the B mode takes on any numerical value can be expected. At this time, it is thought that the parallel resonance frequency determined by the capacitive component C2 and the inductor L2 substantially coincides with the frequency of the C mode and thereby the negative resistance characteristic in FIG. 2 can be obtained.

Figure 3:
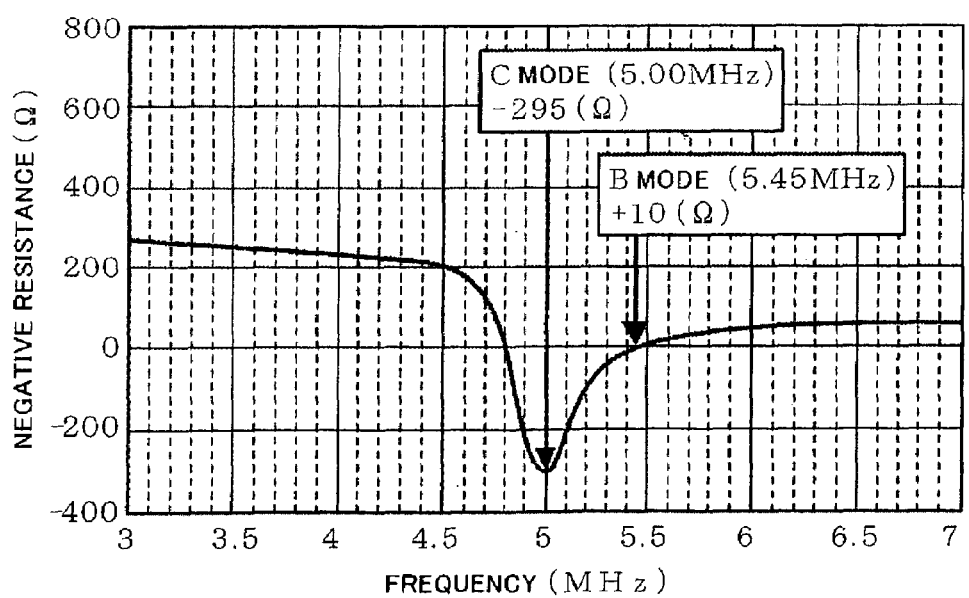
FIG. 3 is a negative resistance characteristic diagram showing a simulation result of a test model of the embodiment.

Hence, in order to confirm the negative resistance characteristic of the above oscillator circuit, an oscillator is manufactured by way of trial using circuit elements having the above circuit constants (C1=43 pF, C2=470 pF, C3=4700 pF, L2=2.2 μH, L1=10 μH), and a result of measurement of a negative resistance characteristic of this oscillator is shown in FIG. 3. From the negative resistance characteristic in FIG. 3, a sufficiently large negative resistance is obtained at the frequency of the C mode (5 MHz) as the principal vibration, and the negative resistance becomes a positive value in the B mode (about 5.45 MHz). From this, it is confirmed that even in an actual device, it is possible to oscillate only in the C mode and completely suppress oscillation in the B mode.

In the present invention, one of conditions is to set the parallel resonance frequency of a parallel circuit composed of the capacitive component C2 and the inductor L2 in the vicinity of the oscillation frequency (frequency of the principal vibration) of the oscillator, and by setting in this manner, a circuit which oscillates in the C mode, for example, as the principal vibration and does not oscillate in the B mode, for example, as the unwanted vibration can be constructed. However, as concerns the frequency difference between the parallel resonance frequency of the parallel circuit and the oscillation frequency of the oscillator which can satisfy the condition of the present invention, the frequency difference cannot be represented by a numerical value. This is because the presence or absence of oscillation depends on the equivalent resistance of the C mode and the equivalent resistance of the B mode of the quartz vibrator, and the negative resistance of the C mode and the negative resistance of the B mode of the oscillator circuit.

A schematic example is given here. If the negative resistance of the C mode and the negative resistance of the B mode of the oscillator circuit are −200Ω and −70Ω, respectively when the equivalent resistance of the C mode and the equivalent resistance of the B mode of the quartz vibrator are 120Ω and 100Ω, respectively, the C mode satisfies the oscillation condition and the B mode does not satisfy the oscillation condition, so that the effect of the present invention can be obtained. However, if the negative resistance of the C mode and the negative resistance of the B mode of the oscillator circuit are −100Ω and −30Ω, respectively even where the same quartz vibrator is used, neither the C mode nor the B mode satisfies the oscillation condition, so that the effect of the present invention cannot be obtained.

More specifically, the present invention is characterized in that the adoption of such circuit configuration as shown in FIG. 1 makes it possible to obtain a circuit configuration in which, for example, the C mode satisfies the oscillation condition and, for example, the B mode does not satisfy the oscillation condition by adjusting the parallel resonance frequency of the parallel circuit composed of the capacitive component C2 and the inductor L2. Adjusting the parallel resonance frequency means setting the parallel resonance frequency in the vicinity of the oscillation frequency of the oscillator, and setting the parallel resonance frequency in the vicinity of the oscillation frequency of the oscillator means that as a result of approximating the parallel resonance frequency of the parallel circuit to the oscillation frequency of the oscillator, such a negative resistance that the C mode satisfies the oscillation condition and the B mode does not satisfy the oscillation condition can be obtained.

Figure 4:
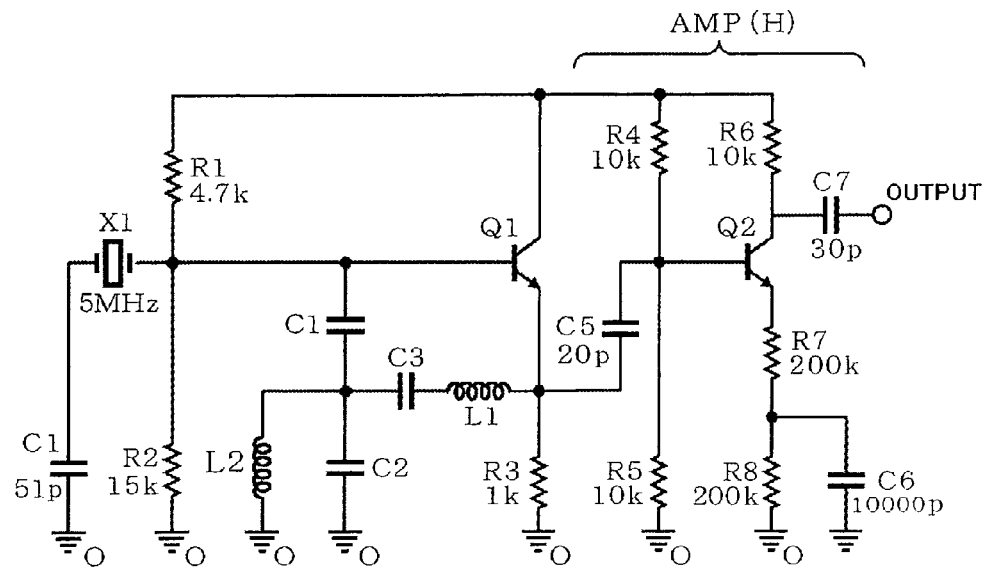
FIG. 4 is a specific oscillator circuit diagram based on the embodiment of the present invention.
Figure 5:
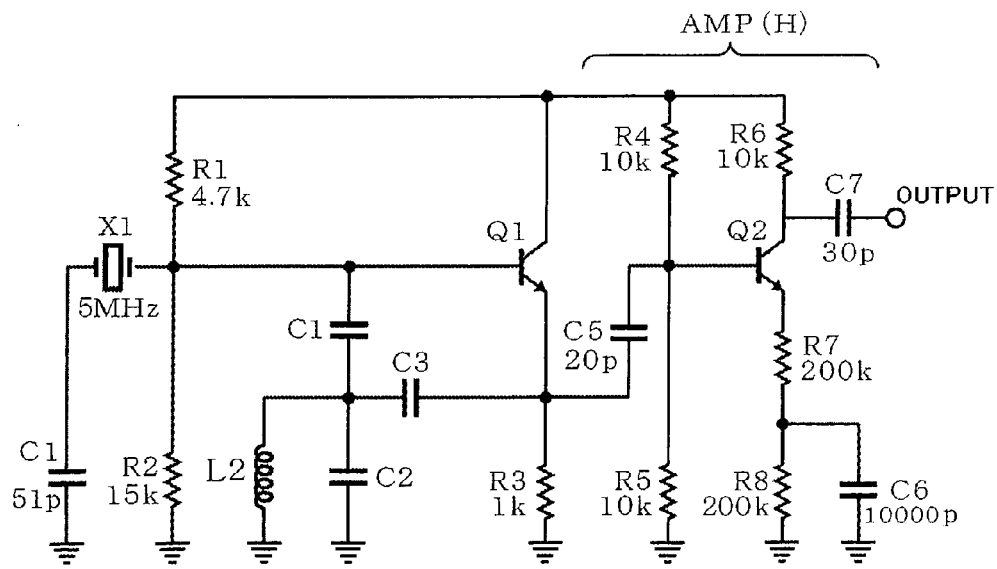
FIG. 5 is a conventional overtone oscillator circuit diagram.

FIG. 4 shows a specific oscillator circuit based on the circuit in FIG. 1, which has a configuration in which an output of the emitter of the transistor Q1 is taken out via a high-frequency amplifier circuit AMP (H). This circuit configuration and a conventional overtone oscillator circuit shown in FIG. 5 are different in the presence or absence of the inductor L1, and in FIG. 4, it is confirmed by experiment to be able to suppress the unwanted vibration in the B mode while obtaining the stable oscillation in the C mode.

Figure 6:
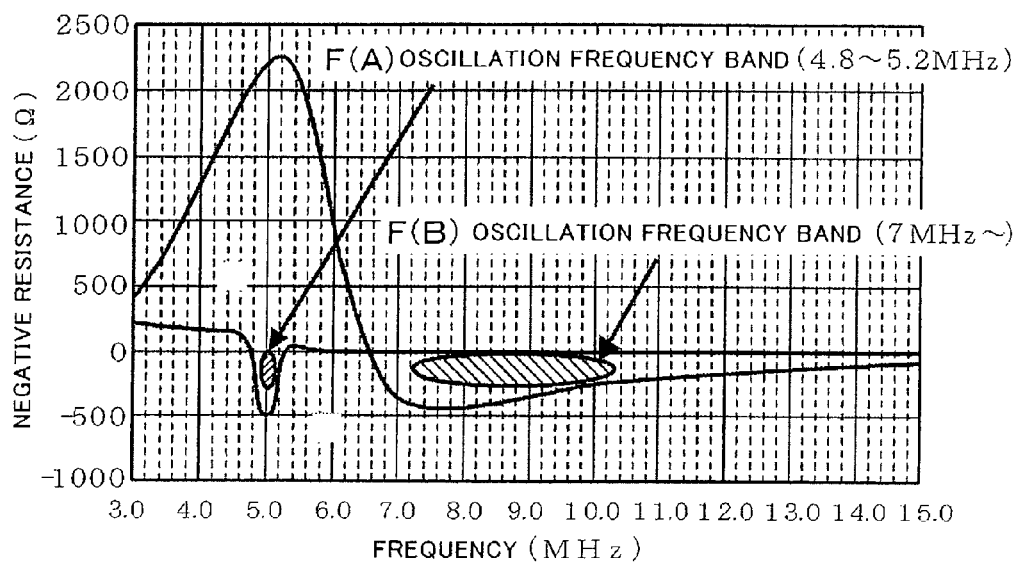
FIG. 6 is a negative resistance characteristic diagram of an overtone oscillator and the oscillator of the embodiment.
Figure 7:
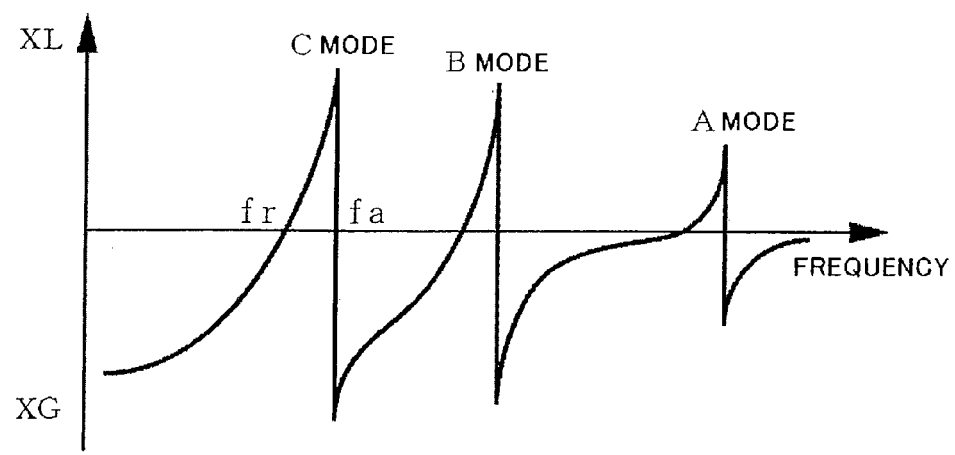
FIG. 7 is a resonance characteristic diagram of an SC-cut vibrator.
Figure 8:
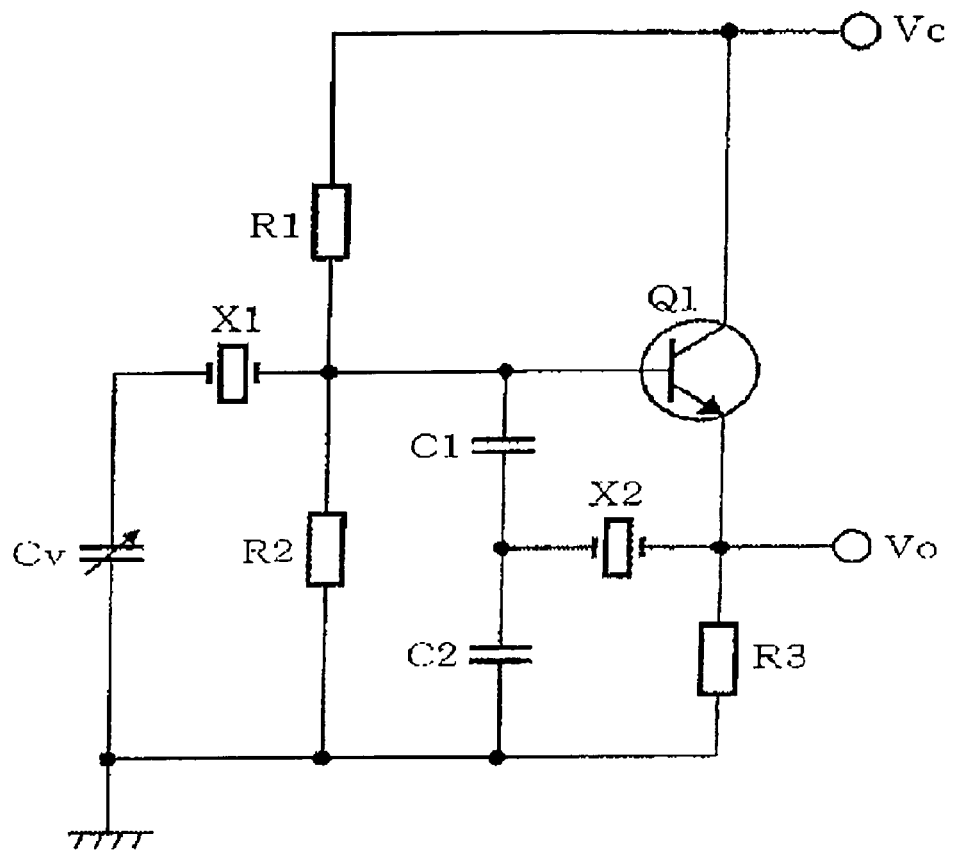
FIG. 8 is a conventional oscillator circuit diagram.

FIG. 6 shows negative resistance characteristics at this time, a characteristic F(A) shows a negative characteristic of the circuit of the present invention shown in FIG. 4, and a characteristic F(B) shows a negative characteristic of the conventional overtone oscillator circuit. As is clear from these negative resistance characteristics F(A) and F(B), in the overtone oscillator circuit, the negative resistance is large in a broad-band frequency range (approximately from 7 MHz to 10 MHz) and in this range, the unwanted oscillation tends to occur, whereas in the present invention, the negative resistance is large in a narrow-band frequency range (a center frequency of 5 MHz) and only in this range, the oscillation becomes possible. As just described, although the circuit diagrams show that the circuit of the present invention and the overtone oscillator circuit are different only in the presence or absence of the inductor L1, it is understood that a completely different operation from that of the overtone oscillator circuit can be obtained by providing the inductor L1 and setting the parallel resonance frequency of the parallel circuit composed of the capacitive component C2 and the inductor L2 in the vicinity of the oscillation frequency of the oscillator.

Incidentally, the suppression of a frequency jump phenomenon, that is, the B mode oscillation, in the quartz oscillator using the SC-cut quartz vibrator is described above, but the present invention can be applied to the suppression of unwanted vibration of an oscillator using some other piezoelectric vibrator such as IT-cut quartz vibrator and obtain an equivalent effect.

As described above, according to the present invention, there is an excellent effect that in the Colpitts oscillator, only by inserting the series circuit of the capacitive component C3 and the inductor L1 between the connection midpoint between the capacitive component C1 and the capacitive component C2 and the emitter of the transistor and inserting the inductor L2 in parallel with the capacitive component C2, the positive negative resistance value can be obtained at the frequency of the B mode, for example, as the unwanted vibration without lowering the negative resistance value at the frequency of the C mode, for example, as the principal vibration, which makes it possible to suppress the unwanted vibration and obtain stable oscillation in the C mode.

There is another effect that a B mode suppressing quartz vibrator becomes unnecessary, and besides only the addition of very few circuit elements is required, which can realize an inexpensive oscillator.

What is claimed is:

1. A Colpitts oscillator, comprising:
a piezoelectric vibrator;
an oscillation amplifying transistor having a base connected to said piezoelectric vibrator at a first connection point between said base and said piezoelectric vibrator, and a having an emitter connected to ground by a first impedance;
a first series circuit connected between said first connection point and ground, said first series circuit including a first capacitive component and a second capacitive component connected in series at a second connection point and each being outside a crystal at said piezoelectric vibrator;
a second circuit including said piezoelectric vibrator which is connected between said first connection point and ground, said second circuit being in parallel with said first series circuit;
a feedback circuit connected between said second connection point said emitter of said transistor, said feedback circuit having a third capacitive component and a first inductor connected in series; and
a second inductor connected in parallel with the second capacitive component, wherein a parallel resonance frequency of a parallel circuit comprised of the second capacitive component and said second inductor is in a vicinity of an oscillation frequency of the oscillator.

2. The Colpitts oscillator according to claim 1, wherein said piezoelectric vibrator is an SC-cut quartz vibrator or an IT-cut quartz vibrator, and the oscillation frequency of the Colpitts oscillator is a frequency of a C mode.

3. The Colpitts oscillator according to claim 2, wherein said first impedance is a feedback resistance connecting said emitter to ground, said feedback resistance and said feedback circuit being connected to a common node at said emitter.

4. The Colpitts oscillator according to claim 3, further comprising first and second bleeder resistors connected in series between a voltage potential and ground, said first and second bleeder resistors being connected together at said first connection point at said base, said first connection point being a circuit node.

5. The Colpitts oscillator according to claim 1, further comprising first and second bleeder resistors connected in series between a voltage potential and ground, said first and second bleeder resistors being connected together at said first connection point to said base, said first connection point being a circuit node.

6. The Colpitts oscillator according to claim 5, wherein said first impedance is a feedback resistance connecting said emitter to ground, said feedback resistance and said feedback circuit being connected to a common node at said emitter.

7. The Colpitts oscillator according to claim 1, wherein said first impedance is a feedback resistance connecting said emitter to ground, said feedback resistance and said feedback circuit being connected to a common node at said emitter.

* * * * *